United States Patent
Wu et al.

(10) Patent No.: US 6,248,662 B1
(45) Date of Patent: Jun. 19, 2001

(54) METHOD OF IMPROVING GAP FILLING CHARACTERISTICS OF DIELECTRIC LAYER BY IMPLANTATION

(75) Inventors: Huang-Hui Wu, Erh-Lin Chen; Yu-Tai Tsai, Ching-Shui Chen; Chien-Chung Huang, Ta-Chia Chen; Yeong-Chih Lai, Nan-Tou, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/296,180

(22) Filed: Apr. 22, 1999

(51) Int. Cl.[7] .................................................. H01L 21/4763
(52) U.S. Cl. ............................................................. 438/632
(58) Field of Search ........................................ 438/632, 663, 438/761, 787, 766, 778, 783

(56) References Cited

U.S. PATENT DOCUMENTS 5,489,553 * 2/1996 Chen ...................................... 437/195

* cited by examiner

Primary Examiner—David Nelms
Assistant Examiner—Quoc Hoang

(57) ABSTRACT

A method of improving gap filling of dielectric layer by implantation is disclosed. When a plurality of semiconductor structures are formed on a semiconductor substrate, there are gaps between portions of the semiconductor structure. First, a dielectric layer is formed over the surface of the semiconductor structure and then an implantation process is employed to implant ions as $BF^{2+}$, $B^{3+}$ and $F^-$ into first dielectric layer and more particularly into part of the first dielectric layer that corresponds to sidewall of semiconductor structure. Afterwards, rapid thermal process is employed to form SiOF molecules and $B_2O_5$ molecules on the first dielectric layer, and then a second dielectric layer is formed over the first dielectric layer. Because SiOF molecules improve step coverage of the second dielectric layer formation and $B_2O_5$ molecules enhance fluidity of second dielectric layer during formation of the second dielectric layer. Thus, not only are these gaps totally filled by second dielectric layer but also there is no void inside the second dielectric layer.

19 Claims, 3 Drawing Sheets

METHOD OF IMPROVING GAP FILLING CHARACTERISTICS OF DIELECTRIC LAYER BY IMPLANTATION

BACKGROUND OF THE INVENTION

1. Field of the Invention

The present invention relates to the fabrication of integrated circuit, and more particularly, to a method of improving the gap filling characteristics of dielectric layer and forming void-free dielectric layer.

2. Description of the Prior Art

In the fabrication of integrated circuit, dielectric materials are employed in many applications such as covering semiconductor structures, forming passivation layer and forming isolation layer. In specially, when packing density of integrated circuit is increased and multi-layer structure is required, dielectric materials are employed to separate alternate layers and then some structures such as inter metal dielectric (IMD) and inter layer dielectrics (ILD) are formed.

In general, dielectric material is formed over a surface that some semiconductor structures are located in and on it. Obviously, not only these semiconductor structures are covered by dielectric layer but also these gaps that locate between portions of semiconductor structures are filled by dielectric layer. No matter how, the formation of dielectric layer is subject to arrival angle effect and shadowing effect. That is, the forming rate of dielectric is faster in the corner region of said semiconductor structures than other regions of said semiconductor structures. Thus, there are voids inside dielectric layer and the density of voids are direct proportion to aspect of said gaps.

FIG. 1A to FIG. 1C illustrate the formation of voids. First, as shown in FIG. 1A, the top surface 11 of semiconductor substrate 10 is planarized and a plurality of semiconductor devices are formed in and on semiconductor substrate 10. Then a plurality of semiconductor structures 12 are formed on top surface 11 and there are gaps 13 between portions of semiconductor structures 12. Second, a first dielectric layer 14 is formed over the top surface 11 and then semiconductor structures 12 are covered by it. Obviously, as FIG. 1B shows, when the aspect of gap 13 is small then only overhangs 15 are formed in the corner parts of semiconductor structures 12, but when the aspect of gap 13 is large then there is void 16 inside gap 13. Third, second dielectric layer 17 is sequentially formed over first dielectric layer 14, where possible material of second dielectric layer 17 comprises material of first dielectric layer 14. Obviously, as shown in FIG. 1C, not only the top surface of second dielectric layer 17 is non-uniform where dips 18 are located above the gaps 13 but also there are voids 16 inside the second dielectric layer and the location of voids 16 correspond to the location of gap 13.

According to the previous discussion, it is obvious that when aspect of gap 13 is large enough, there are voids 16 within the gap 13 or above the gap 13 and the quality of the integrated circuit is degraded by these voids 16. Thus, it is desired to find a gap filling technique that will fill a gap without the presence of any void and then the formed integrated circuit is void-free.

SUMMARY OF THE INVENTION

Correspondingly, the primary object of the present invention is to propose a method for improving the gap filling characteristics of the dielectric layer to form a void-free dielectric layer.

A further object of the present invention is to propose a method that improves the gap filling and step coverage characteristics of the dielectric layer by implantation.

Moreover, a specific object is to propose a method which improves gap filling of the borophosph tetraethyl-orthosilica (BPTEOS) layer by application of SiOF and $B_2O_5$.

In order to accomplish these objects of the invention, a method for improving gap filling characteristics of dielectric layer by implantation is proposed. The provided method comprises the following steps:

First, semiconductor devices are formed in and on a semiconductor substrate wherein the top surface of said semiconductor substrate is planarized.

Second, semiconductor structures are formed overlying said top surface wherein gaps are located between portions of said semiconductor structures, then a first dielectric layer is formed to cover these semiconductor structures.

Third, a photoresist is formed to cover part of the first dielectric layer and then excess first dielectric layer is implanted by ions such as $BF^{2+}$, $B^{3+}$, $F^-$, where photoresist does not cover these gaps.

Afterwards, rapid thermal process is employed to treat the first dielectric layer whereby SiOF molecules and $B_2O_5$ molecules are formed on the surface of excess first dielectric layer.

Finally, a second dielectric layer is formed over the first dielectric layer wherein SiOF molecules improve step coverage of the second dielectric layer formation and $B_2O_5$ molecules enhance fluidity of the second dielectric layer during formation of the second dielectric layer. Thus, not only is each gap totally filled by the second dielectric layer but also there is no void produced inside the second dielectric layer.

BRIEF DESCRIPTION OF THE DRAWINGS

In the accompanying drawings forming a material part of this description, these are shown.

DESCRIPTION OF THE PREFERRED EMBODIMENT

Figure 1A:
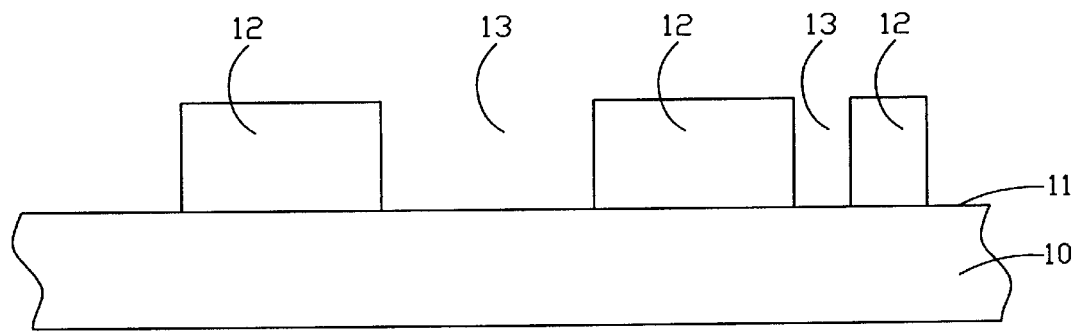
FIGS. 1A to 1C illustrate the formation mechanism of voids in the dielectric layer according to the prior art.
Figure 1B:
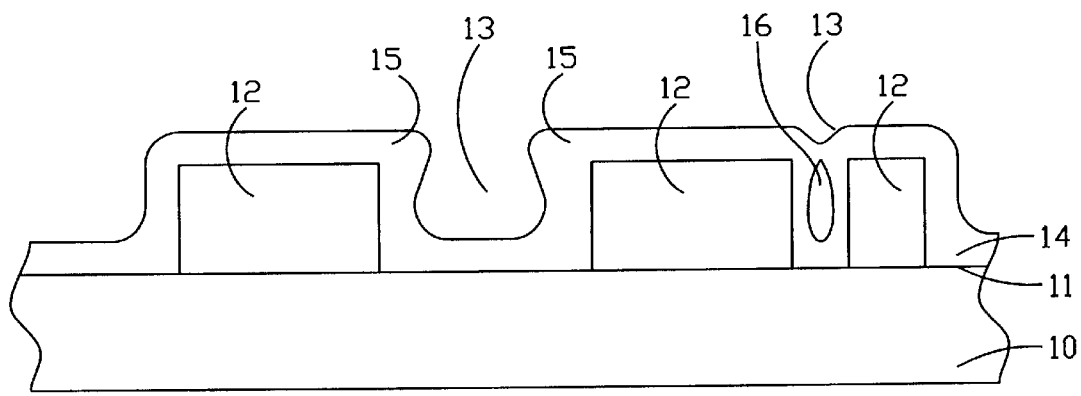
Figure 1C:
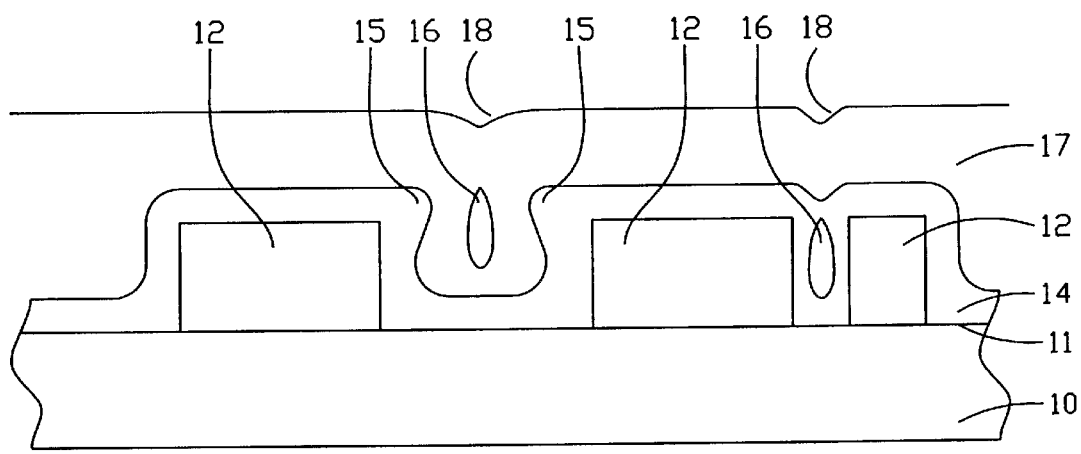
Figure 2A:
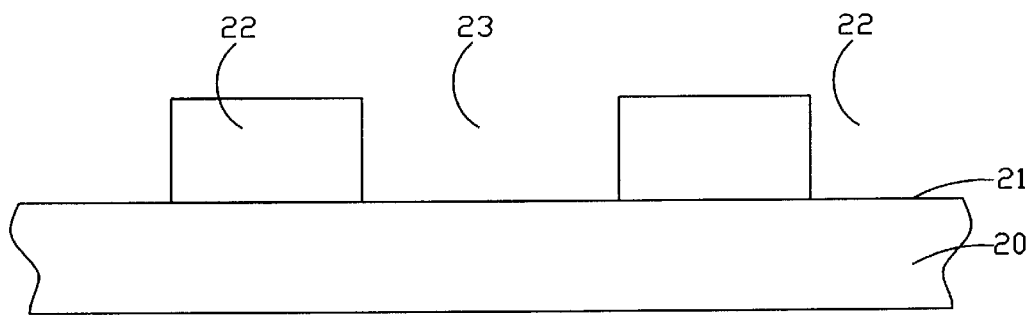
FIG. 2A to FIG. 2E are cross-sectional representations of a preferred embodiment of the present invention.

Referring to FIG. 2A, a plurality of semiconductor structures 22 are formed overlying the semiconductor substrate 20, where a plurality of semiconductor devices are formed in and on the semiconductor substrate 20. Possible semiconductor devices comprise gates, electrodes, source and drain regions, and possible semiconductor structures 22 comprising metal line, gate, and capacitor. In general, the top surface 21 of semiconductor substrate 20 is planarized to ensure stability of the semiconductor structures 22, which is more important in multi-layer structure. Obviously, because semiconductor structures 22 are patterned there are gaps 23 between portions of semiconductor the structures 22.

Figure 2B:
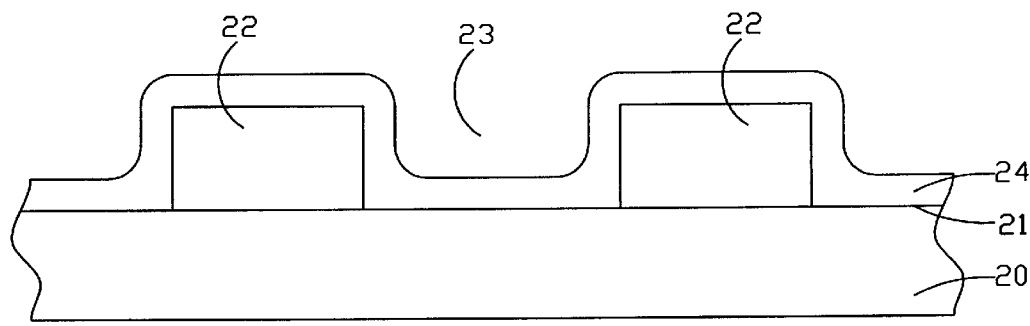

Afterwards, as shown in FIG. 2B, a first dielectric layer 24 is formed over semiconductor substrate 20 and covers semiconductor structures 22. Where possible material of the first dielectric layer 24 comprises undoped silicate glass (USG), oxide and tetraethyl-orthosilica (TEOS), USG is widely employed as there is no impurity inside USG and then the electricity of the semiconductor structures 22 will not be affected by it. Note that the depth of first dielectric layer 24 is thin enough such that no significant overhang is formed. In other words, there is no void inside first dielectric layer 24. In general, the first dielectric layer 24 is conformally formed by chemical mechanical deposition (CVD).

Figure 2C:
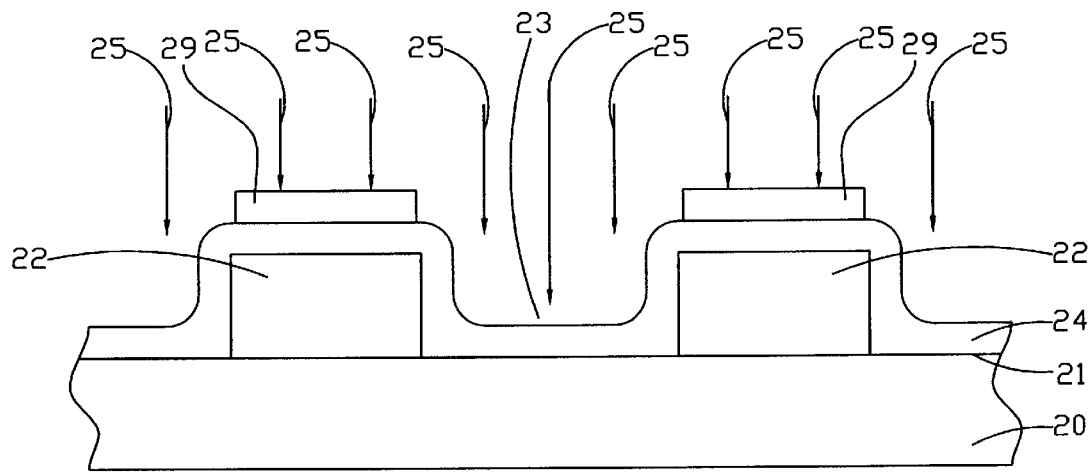

Now referring to FIG. 2C, the implantation treatment of the present invention will be described. Photoresist 29 is formed above the first dielectric layer 24, where photoresist 29 does not cover gaps 23. Then, first dielectric layer 14 is treated by implantation and implanted ions 25 such as $BF^{2+}$, $B^{3+}$, $F^-$ are implanted into part of first dielectric layer 24 that is not covered by photoresist 29. Furthermore, the energy of the implanted ions 25 is restricted so that the implanted ions 25 are only concentrated in the surface of the first dielectric layer 24, and the dosage of implanted ions is also adjustable. Where possible ion sources comprise a $BF_3$ ion source and a typical dosage of implanted ions 25 is about $1.0E16/cm^3$ and the typical energy of implanted ions 25 is about 5.0 KeV.

Figure 2D:
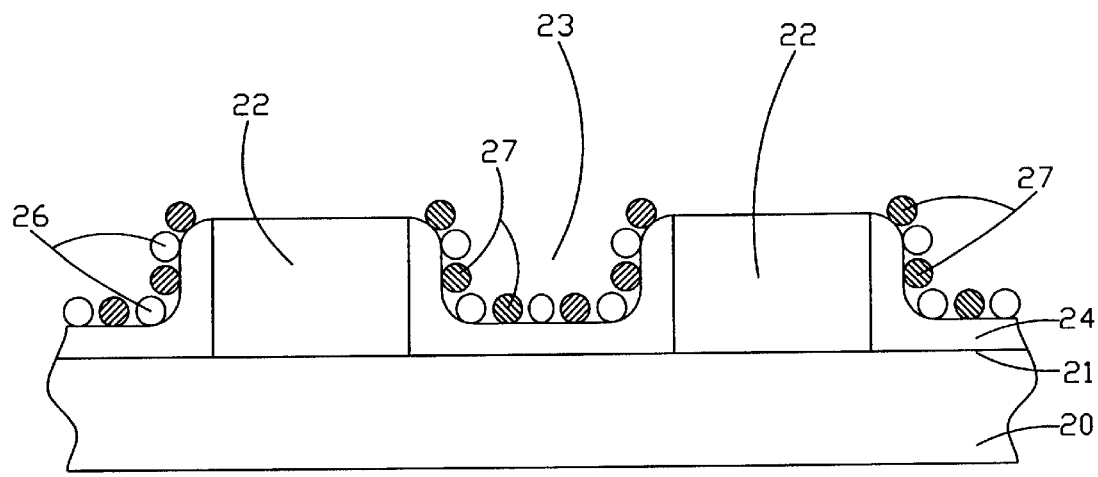

Thereafter photoresist 29 is removed and thermal treatment is employed to treat first dielectric layer 24, where a typical thermal treatment is the rapid thermal process with a temperature of about 1000° C. to 1100° C. and a duration of about 20 seconds. Thus, as FIG. 2D shows, implanted ions 25 are eliminated and then $B_2O_5$ molecules 26 and SiOF molecules 27 are formed on the first dielectric layer 24. In addition, $B_2O_5$ molecules 26 and SiOF molecules 27 are mixed. It should be noted that because accompanying thermal diffusion will affect the electricity of the semiconductor structure 22, a tube is not a good thermal treatment in the proposed embodiment.

Figure 2E:
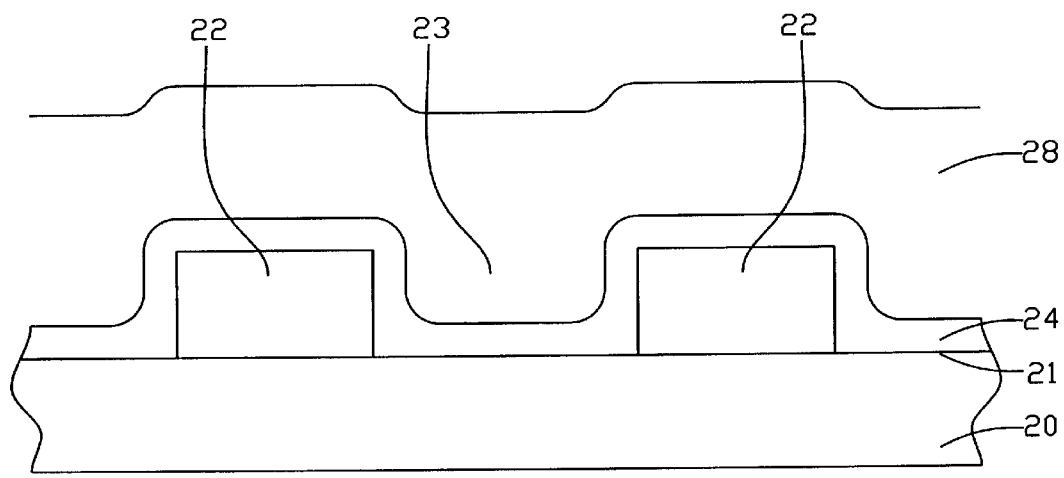

Referring to FIG. 2E the second dielectric layer 28 is formed overlying the first dielectric layer 24, wherein general the second dielectric layer 28 is formed by a deposition method. Herein, not only the presence of SiOF molecules 27 improve step coverage of the second dielectric layer 28, but also the presence of $B_2O_5$ molecules 26 enhance fluidity of the second dielectric layer 28. Thus, gaps 23 are totally filled by the second dielectric layer 28 and there is no void inside the second dielectric layer 28.

Note that possible material of the second dielectric layer 28 comprises oxide, TEOS and BPTEOS, where doped boron and doped phosphorus are employed to adjust electricity of the second dielectric layer 28 and decrease the glass transition temperature of BPTEOS to about 700°C. to 900°C. Thus, BPTEOS is the more popular material of second dielectric layer 28. However, the fluidity of the second dielectric layer 28 also is enhanced by $B_2O_5$ molecules 26. Besides, when second dielectric layer 28 is a BPTEOS layer, it is formed by a depositing method under a pressure of about 2.2 torrs and with a temperature of about 410°C.

Obviously, $B_2O_5$ molecules 26 and SiOF molecules 27 that efficiently improve filling of second dielectric layer 28 are concentrated in the sidewall of gaps 23 and more particularly concentrated in corner region of the first dielectric layer 24. Photoresist 29 is omissible in the embodiment to simplify related fabrication.

It should be noted that because the second dielectric layer 28 is void-free, the proposed invention is an effective method of improving gap filling characteristics of dielectric layer by implantation, and then is a practical method of manufacturing an integrated circuit.

While the present invention has been particularly shown and described with reference to the preferred embodiment thereof, it will be understood by those skilled in the art that various changes in form and details may be made without departing from the spirit and scope of the invention.

What is claimed is:

1. A method of manufacturing an integrated circuit, said method comprising:
   providing a plurality of semiconductor devices in and on a semiconductor substrate;
   forming a plurality of semiconductor structures overlying a top surface of said semiconductor substrate, wherein a plurality of gaps locate between portions of said semiconductor structures;
   forming a first dielectric layer over said top surface and covering said semiconductor structures;
   forming a photoresist over said first dielectric layer, wherein said photoresist does not never cover said gaps;
   implanting said first dielectric layer with a $BF_3$ ion source whereby a plurality of implanted ions such as $BF^{2+}$, $B^{3+}$, $F^-$ are implanted in part of said first dielectric layer that not covered by said photoresist;
   removing said photoresist;
   treating said part of said first dielectric layer with rapid thermal process whereby $B_2O_5$ molecules and SiOF molecules are formed on said part of said first dielectric layer;
   forming a second dielectric layer over said first dielectric layer; and
   completing a fabrication of said integrated circuit.

2. The method according to claim 1, wherein dosage of said implanted ions is about $1.0E16/cm^3$.

3. The method according to claim 1, wherein energy of said implanted ions is about 5.0 Kev.

4. The method according to claim 1, wherein temperature of said rapid thermal process is about 1000° C. to 1100° C.

5. The method according to claim 1, wherein period of said rapid thermal process is about 20 seconds.

6. The method according to claim 1, wherein presence of said SiOF molecules improve step coverage of said second dielectric layer formation.

7. The method according to claim 1, wherein presence of said $B_2O_5$ molecules enhance fluidity of said second dielectric layer.

8. A method of improving gap filling characteristics of oxide layer by implantation comprising:
   forming a plurality of semiconductor devices over a semiconductor substrate, wherein a top surface of said semiconductor substrate is ordinary planarized;
   depositing a conductive layer overlying said top surface and patterning said conductive layer;
   depositing a first oxide layer over said conductive layer wherein a plurality of gaps remain between portions of said first oxide layer that covering said patterned conductive layer;
   forming a photoresist over said first oxide layer, wherein said photoresist never covering said gaps;
   treating said first oxide layer with implantation whereby ions such as $BF^{2+}$, $B^{3+}$, $F^-$ are implanted in part of said first dielectric layer that not covered by said photoresist;
   removing said photoresist;
   treating said first oxide layer with rapid thermal process whereby $B_2O_5$ molecules and SiOF molecules are formed on said part of said oxide dielectric layer; and
   forming a second oxide layer over said first oxide layer wherein said gaps are totally filled by said second oxide layer, wherein said SiOF molecules improve step coverage of said second oxides layer formation and said $B_2O_5$ molecules enhance fluidity of said second oxide layer during said second oxides layer formation.

9. The method according to claim 8, wherein said first oxide layer comprises USG layer.

10. The method according to claim 8, wherein said second oxide layer comprises BPTEOS layer.

11. The method according to claim 8, wherein said ion source of said implantation comprises $BF_3$ ion source.

12. A method of improving gap filling of dielectric layer by implantation, said method comprising:

providing a plurality of semiconductor devices in and on a semiconductor substrate wherein a top surface of said semiconductor substrate is ordinary planarized;

forming a plurality of semiconductor structures overlying said top surface of said semiconductor devices, wherein a plurality of gaps locate between portions of said semiconductor devices;

conformally depositing a USG layer over said semiconductor structures;

forming a photoresist on top surface of said semiconductor structures, wherein said photoresist does not cover said gaps;

treating said USG layer by implanting with an ion source such as $BF_3$ ion source whereby a plurality of implanted ions such as $BF^{2+}$, $B^{3+}$, $F^-$ are implanted in part of said USG layer that not covered by said photoresist;

removing said photoresist layer;

treating said USG layer with rapid thermal process whereby $B_2O_5$ molecules and SiOF molecules are formed on surface of said part of said USG layer; and depositing a BPTEOS layer over said USG layer and totally filling said gaps.

13. The method according to claim 12, wherein dosage of said implanted ions is about $1.0E16/cm^3$.

14. The method according to claim 12, wherein energy of said implanted ions is about 5.0 Kev.

15. The method according to claim 12, wherein temperature of said rapid thermal process is about 1000° C. to 1100° C.

16. The method according to claim 12, wherein period of said rapid thermal process is about 20 seconds.

17. The method according to claim 12, wherein said depositing a BPTEOS layer is under a pressure of about 2.2 torrs and with a temperature about 410° C.

18. The method according to claim 12, wherein said SiOF molecules improve step coverage of subsequent said BPTEOS layer.

19. The method according to claim 12, wherein said $B_2O_5$ molecules enhance fluidity of said BPTEOS layer.

* * * * *